United States Patent
Hwang et al.

(10) Patent No.: US 7,806,974 B2
(45) Date of Patent: Oct. 5, 2010

(54) HIGHLY CONDUCTIVE INK COMPOSITION AND METHOD FOR FABRICATING A METAL CONDUCTIVE PATTERN

(75) Inventors: Gue-Wuu Hwang, Hsinchu (TW); Bao-Tsan Ko, Pingtung County (TW); Yi-Shin Lin, Hsinchu County (TW)

(73) Assignee: Industrial Technology Research Institute, Hsinchu (TW)

( * ) Notice: Subject to any disclaimer, the term of this patent is extended or adjusted under 35 U.S.C. 154(b) by 1133 days.

(21) Appl. No.: 11/439,242

(22) Filed: May 24, 2006

(65) Prior Publication Data

US 2007/0154644 A1    Jul. 5, 2007

(30) Foreign Application Priority Data

Dec. 30, 2005    (TW) .............................. 94147653 A

(51) Int. Cl.
*C09D 11/00*    (2006.01)
(52) U.S. Cl. .................... 106/31.92; 252/500; 252/512; 252/513; 252/514; 252/519.2; 427/466
(58) Field of Classification Search ................ 252/500, 252/512, 513, 514, 519.2; 106/31.92; 427/466
See application file for complete search history.

(56) References Cited

U.S. PATENT DOCUMENTS 5,882,722 A * 3/1999 Kydd ......................... 427/98.4
6,322,620 B1 * 11/2001 Xiao ........................ 106/31.92
2004/0214920 A1   10/2004 Aoshima
2005/0046675 A1    3/2005 Aoshima
2005/0046683 A1 *  3/2005 Kasai ......................... 347/100
2005/0129843 A1 *  6/2005 Wu et al. .................... 427/180

FOREIGN PATENT DOCUMENTS

| JP | 5217417 A | 8/1993 |
| TW | 588096 | 11/1990 |
| TW | 473738 | 1/2002 |
| TW | 505685 B | 10/2002 |
| TW | 238117 B | 8/2005 |
| WO | WO-2004/067647 A2 | 8/2004 |

OTHER PUBLICATIONS

K.F. Teng et al., Liquid Ink Jet Print with MOD Inks for Hybrid Microcircuits, IEEE Transactions on Components, Hybrids, and Manufacturing Technology, Dec. 1987, 545-549, CHMT-12-4.

* cited by examiner

*Primary Examiner*—Douglas Mc Ginty
*Assistant Examiner*—Haidung D Nguyen
(74) *Attorney, Agent, or Firm*—Birch, Stewart, Kolasch & Birch, LLP

(57) ABSTRACT

A viscosity controllable highly conductive ink composition. The highly conductive ink composition comprises an organic solvent, nanoscale metal particles or metallo-organic decomposition compounds, and a thermally decomposable organic polymer. Specifically, since the thermally decomposable polymer can increase the viscosity of the highly conductive ink composition and be removed by subsequent thermal treatment, so as to decrease the impact on conductivity by organic polymer. Therefore, a viscosity-controllable conductive ink composition is obtained.

12 Claims, 1 Drawing Sheet

HIGHLY CONDUCTIVE INK COMPOSITION AND METHOD FOR FABRICATING A METAL CONDUCTIVE PATTERN

BACKGROUND OF THE INVENTION

1. Field of the Invention

The present invention relates to a highly conductive ink composition, and more particularly relates to a viscosity controllable ink composition with high conductivity.

2. Description of the Related Art

Advances in semiconductor manufacturing processes for integrated circuits or liquid crystal displays continuously reduce the size of the semiconductor device and increases the density of the circuits in order to obtain better efficiency. To meet these requirements, metal conductive patterns serving as a conductive lines or electrodes require greater integration density and shorter line widths.

In general, metal conductive patterns are formed on a substrate by a photolithography process, wherein the photolithography process comprises the following procedures: a metal layer is firstly formed on the substrate by chemical vapor deposition, plasma deposition, or spin coating; a photoresist layer is then coated on the metal layer; thereafter, the photoresist layer is then selectively exposed by a mask and UV-radiation; the exposed photoresist layer is then developed by a developing agent to form a patterned photoresist layer; finally, the metal layer is etched utilizing the patterned photoresist layer as an etching mask, so as to form a metal conductive pattern on the substrate.

Due to the great number of complicated steps in the photolithography process and the amount highly pure chemicals, expensive photoresist composition, and etching agents required, process costs are high and environmental protection suffers. Besides, many steps of the photo lithography process are requested to process in high temperature and/or high pressure environment. Thus, the process costs also get increasing. Moreover, metal vapor may diffuse in the manufacturing equipment under the high temperature environment when depositing metal layer, so as to degrade efficiency of electronic equipment and cause damage on equipment.

In order to solve the problem generated from forming a metal conductive pattern so far, so-called screen printing is further proposed to form a metal conductive pattern. Compared with photo lithography process, screen printing has more simple manufacturing procedure and process environment with relatively lower temperature. However, the formed patterned metal layer by screen printing has worse adhesion to the substrate, thus, peeling is easily occurred and yield decreases.

Compared with screen printing, conductive lines or electrode patterns fabricated by ink jet printing has benefits of computers in control and highly automation, so as to lower the manufacturing cost. In *IEEE Transactions components Hybrids and Manufacturing Technology* (Vol. 12(4), 1987, Pages 545-549), "Liquid ink-jet printing with MOD inks for hybrid microcircuits" published by R. W. Vest et al provides a method of forming a metal conductive pattern by ink-jet printing process, which utilizes a ink composition containing a metallo-organic decomposition compounds, MOD, decomposable at a low temperature followed by transferring to metal or metal oxide after forming a conductive pattern. Nevertheless, due to the viscosity of MOD solution is pretty low (<2 cP), the metal conductive layer produced by the ink composition is very thin, and the sheet resistance easily gets extremely high. Therefore, to reduce resistance, the ink jet printing process needs be reproduced multiple times to increase the total thickness by adding the formed metal conductive layers. Thus, the required time for process is prolonged, the process gets complicated, cost increases, and the short of the device is occurred resulted from the misalignment of the subsequently formed metal conductive layer makes.

Thus, a simpler manufacturing method for developing a metal conductive pattern, capable of improving the integrated circuit and liquid crystal display performance is desirable.

BRIEF SUMMARY OF THE INVENTION

The invention provides a highly conductive ink composition capable of controlling viscosity during the manufacturing process and a method for fabricating the same. A detailed description is given in the following embodiments with reference to the accompanying drawings.

An embodiment of a viscosity controllable ink composition with high conductivity is provided. The highly conductive ink composition comprises an organic solvent, nanoscale metal particles or metallo-organic decomposition compounds, and a thermally decomposable organic polymer. Specifically, since the thermally decomposable organic polymer can increase the viscosity of the highly conductive ink composition and can be removed by subsequent thermal treatment, so as to decrease the impact on conductivity by organic polymer. Therefore, a solvent with a desired viscosity can be obtained by controlling and adjusting different solvent according to the highly conductive ink composition of the disclosure.

An embodiment of a method for fabricating a metal conductive pattern is provided. The method comprises forming an highly conductive ink composition on a predetermined area on a substrate and thermally forming the highly conductive ink composition on the substrate, so as to decompose the thermally decomposable metal organic compounds and the thermally decomposable organic polymers to volatile organic molecules. Thereafter, the volatile organic molecules are removed to form a metal conductive layer. The method of forming the highly conductive ink composition on a substrate comprises screen printing, spin coating, and ink jet printing processes.

BRIEF DESCRIPTION OF THE DRAWINGS

The present invention can be more fully understood by reading the subsequent detailed description and examples with references made to the accompanying drawings, wherein.

DETAILED DESCRIPTION OF THE INVENTION

Figure 1:
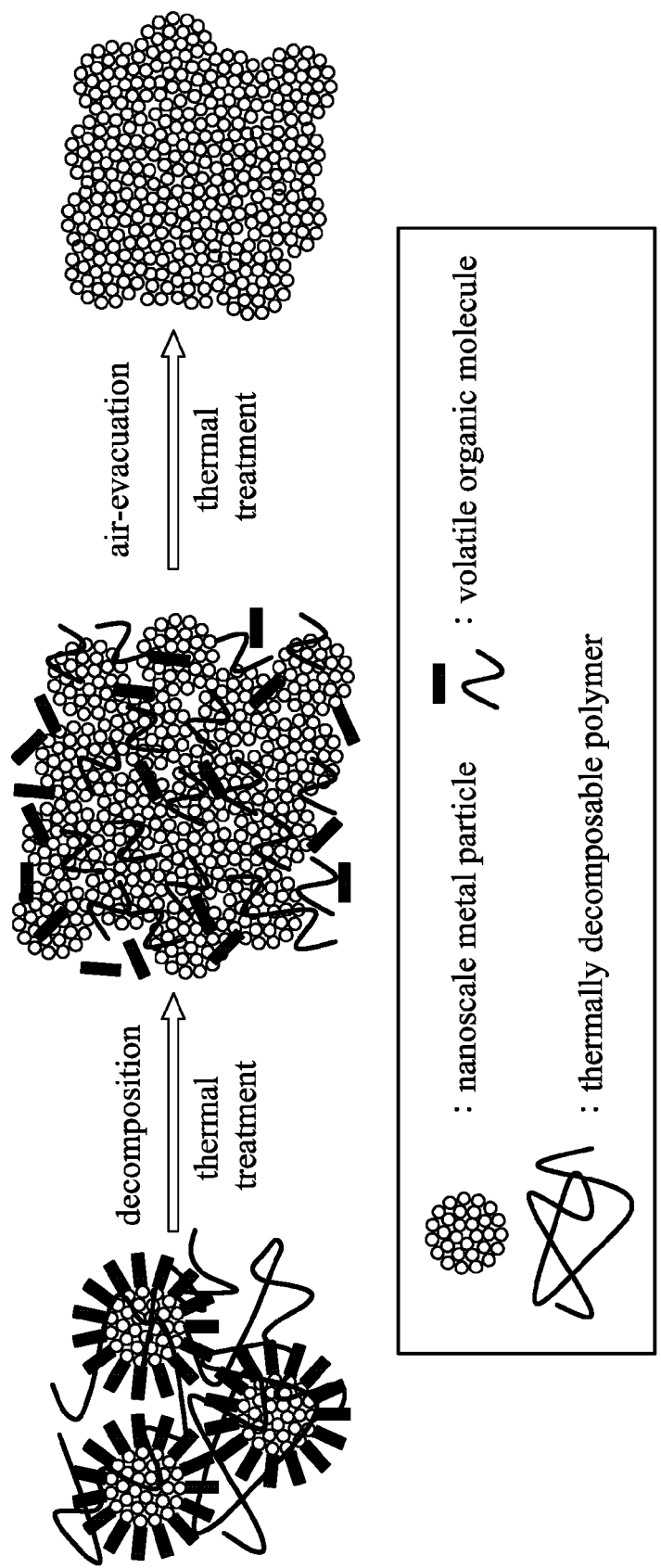
FIG. 1 shows the mechanism of forming a metal conductive layer by highly conductive ink composition.

The following description is of the best-contemplated mode of carrying out the invention. This description is made for the purpose of illustrating the general principles of the invention and should not be taken in a limiting sense. The invention is an improved bonding pad and method for their fabrication. Although the invention is described with respect to a specific embodiment, the principles of the invention, as defined by the claims appended herein, can obviously be applied beyond the specifically described embodiments of the invention described herein. Moreover, in the description of the invention, certain details have been left out in order to not obscure the inventive aspects of the invention. The details left out are within the knowledge of a person of ordinary skill in the art.

A highly conductive ink composition is provided. An exemplary embodiment of the highly conductive ink composition comprises an organic solvent, a nanoscale metal particle or a metallo-organic decomposition compound, and a thermally decomposable polymer, wherein the nanoscale metal particle or the metallo-organic decomposition compound and the thermally decomposable polymer are homogeneously dispersed in the organic solvent. One of the primary technical characteristics in the disclosure is to increase the viscosity of the highly conductive ink composition by utilizing the thermally decomposable polymer, so as to increase the viscosity of the highly conductive ink composition, thus, the formed thin film is not easily diffused. A metal layer with sufficient thickness is obtained after a thermal process without reproducing many of the same procedures for forming a multi-layer structure with sufficient thickness of the related art.

In one embodiment, the nanoscale metal particle in is a metal particle with a diameter ranging from 1 to 800 nanometers, for example, the metal particle can be a metal particle of Au, Ag, Cu, Fe, Al, Pd or Ni.

In one embodiment, the thermally metallo-organic decomposition (MOD) compound is a metal compound binding with an organic functional group. The organic functional group is removed during thermally processing. In other words, the binding between the organic functional group and metal is broken. The metallo-organic compound comprises a metal organic compound of Au, Ag, Cu, Fe, Al, Pd or Ni with an organic functional group, wherein the organic functional group comprises the carboxyl, thiol, amine, su;fonyl, phosphate, or isocyano group.

The thermally decomposable organic polymer in the disclosure is a pure organic polymer which is thermally decomposed into small molecules in the temperature range from 45° C. to 300° C. Preferably, the thermally decomposable organic polymer comprises a chemical structure with a formula shown as (I), (II), or (III) below:

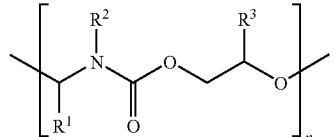

Formula (I)

$HO-(CR^4R^5O)_n-H$

Formula (II)

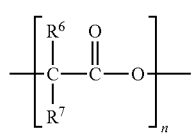

Formula (III)

wherein $R^1$ comprises an alkyl group containing 1 to 8 carbon atoms or an aromatic group containing 3 to 8 carbon atoms; $R^2$ and $R^3$ respectively comprise an alky group containing 1 to 8 carbon atoms, an alkoxide group containing 1 to 8 carbon atoms, a cycloalkyl group containing 3 to 8 carbon atoms, an aromatic group containing 3 to 8 carbon atoms, or aralkyl group; $R^4$, $R^5$, $R^6$, and $R^7$ respectively comprise a hydrogen atom, a fluorine atom, an alkyl group containing 1 to 8 carbon atoms, or an aromatic group containing 3 to 8 carbon atoms, and n is an integer more than 1. Note that the highly conductive ink composition has a viscosity proportional to the molecular weight of the thermally decomposable organic polymer. Therefore, the viscosity of conductive ink composition can be adjustable and controllable by utilizing thermally decomposable organic polymers with different molecular weight. Simultaneously, the thickness of the formed metal conductive layers can be also controllable. Accordingly, the average molecular weight of the thermally decomposable organic polymer ranges from 1000 to 300000 g/mole.

In some embodiments, the ratio of molecular weight of a nanoscale metal particle (or a thermally metallo-organic decomposition compound) and a thermally decomposable organic polymer ranging from 1:9 to 9:1. The conductive ink composition has a viscosity more than 2 cP. The conductive ink composition preferably has a viscosity from 4 cP to 40 cP for the ink jet printing process.

The organic solvent is not specifically restricted in the disclosure. In general, a solvent in which a nanoscale metal particle (or a thermally-metallo-organic decomposition compound) and a thermally decomposable organic polymer can disperse is acceptable in the disclosure, for instance, the solvent can be xylene or toluene.

The highly conductive ink composition further comprises a catalyst to expedite the thermally metallo-organic decomposition compounds and the thermally decomposable organic polymers to thermally degrade. The catalyst can be a protonic acid, such as dodecylbenzenesulfonic acid. Furthermore, the highly conductive ink composition comprises adding an additive therein, wherein the additive comprises a polymer or an organic compound, such as poly(methyl methacrylate).

A method for fabricating a metal conductive pattern is also provided in this disclosure. The method comprises forming a highly conductive ink composition on a predetermined area of a substrate and thermally forming the highly conductive ink composition on the substrate, so as to degrade the thermally metallo-organic decomposition compounds and the thermally decomposable organic polymers to volatile organic molecules. Thereafter, the volatile organic molecules are air-evacuated and a metal conductive layer is then formed. The mechanism of forming a metal conductive layer by highly conductive ink composition is shown in FIG. 1.

The method of forming the highly conductive ink composition on a substrate comprises screen printing, spin coating, and ink jet printing processes.

The disclosure has been described by way of examples and comparative examples or in terms of the preferred embodiments to illustrated the preparation of thermally metallo-organic decomposition compounds, thermally decomposable polymers, highly conductive ink composition, and metal conductive layer, so as to clarify the disclosure.

Preparation of the Thermally Metallo-organic Decomposition Compounds

EXAMPLE 1

Decanoic acid ($C_9H_9COOH$, 10 g) was dissolved in 50 ml methanol, and sodium hydroxide solution (2.4 g NaOH added in 50 ml water) was gradually added to the solution. Thus, a mixed solution was obtained after reacting 30 minutes at room temperature. Thereafter, silver nitrate ($AgNO_3$) solution (9.8 g silver nitrate added in 50 ml water) was gradually added to the mixed solution. The mixed solution is filtered when the reaction is complete. After a drying procedure, a thermally decomposable organic silver particle (silver neodecanoate, SND), a white solid product is formed. The synthesis procedure of the thermally decomposable organic silver particle is shown as the reaction formula below:

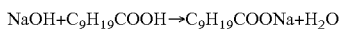

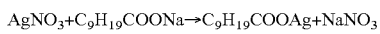

Preparation of Thermally Decomposable Polymers

EXAMPLE 2

N-hexylamine (8.8 g, 100 mmole) and ethylene carbonate (10.12 g, 100 mmole) was mixed into a solution, and the solution is then further heated to 70° C. After reacting for 5 hours, the product was purified by vacuum distillation (128-130° C./0.05 mmHg) to form 2-hydroxyethyl N-hexyl-carbamate (compound I), 15.1 g (yield: 80%), which is an achromatic oily liquid. 2-hydroxyethyl N-hexyl-carbamate (compound I, 4.73 g, 25 mmole), benzaldehyde dimethylacetal (3.79 g, 25 mmole), and a catalyst of p-toulenesulfonic acid (0.05g) are mixed. Thus, the mixed solution was gradually heated to 160° C. and then reacted for 2 hours. Methanol formed in the period is then removed. Thereafter, the mixed solution was processed by vacuum distillation (0.01 mmHg) and heated to 200° C. A thermally decomposable polymer (A) (poly(N,O)acetal, PA) 5.5 g (yield: 65%) was obtained after 2 hours, which is a highly viscous oily constituent with orange-red color. Referring to the reaction formula below, the synthesis procedure of the thermally decomposable polymer (A) is shown below:

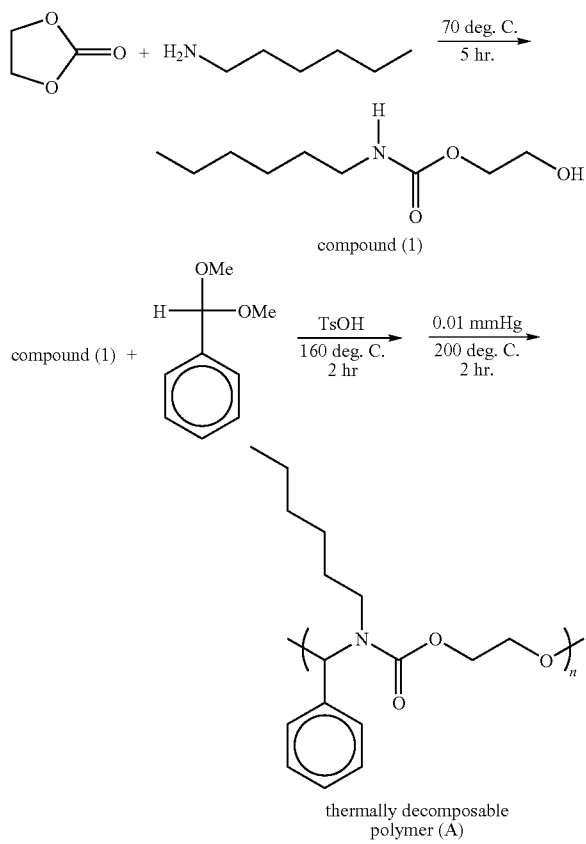

The thermally decomposable polymer recited in the disclosure is degraded into a volatile compound with small molecules. Take the thermally decomposable polymer (A) for example, the thermally decomposable polymer (A) is decomposed into a volatile compound with small molecule when it is heated above 55° C. The formula is listed below:

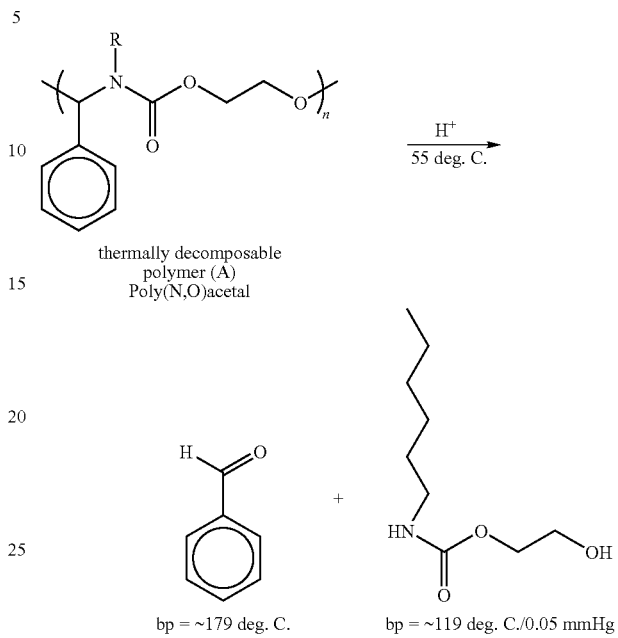

Preparation of Highly Conductive Ink Composition

COMPARATIVE EXAMPLE 1

The thermally decomposable organic silver particle formed in the example 1 is dissolved in xylene to prepare a highly conductive ink composition (a), wherein the thermally decomposable organic silver particle has a weight percentage of 20 wt % and the weight percentage is based on the total weight of the highly conductive ink composition (a). Thereafter, the viscosity and photo stability of the ink composition were further measured. The measurement result is shown in Table 1.

COMPARATIVE EXAMPLE 2

The thermally decomposable organic silver particle formed in the example 1 was dissolved in xylene to prepare a highly conductive ink composition (b), wherein the thermally decomposable organic silver particle has a weight percentage of 40 wt % and the weight percentage is based on the total weight of the highly conductive ink composition (a). Thereafter, viscosity and photo stability of the ink composition were further measured. The measurement result is shown in Table 1.

COMPARATIVE EXAMPLE 3

The thermally decomposable organic silver particle formed in the example 1 is dissolved in xylene, in addition, polymethyl methacrylate (PMMA, weight-average molecular weight (Mw): 2300 g/mol) is further added in the solution, to prepare a highly conductive ink composition (c), wherein the thermally decomposable organic silver particle has a weight percentage of 40 wt % and polymethyl methacrylate has a weight percentage of 3 wt %. The weight percentage is based on the total weight of the highly conductive ink composition (c). Thereafter, viscosity and photo stability of the ink composition were further measured. The measurement result is shown in Table 1.

COMPARATIVE EXAMPLE 4

The thermally decomposable organic silver particle formed in example 1 was dissolved in xylene, in addition, polymethyl methacrylate (PMMA, weight-average molecular weight (Mw): 2300 g/mol) was further added to the solution, to prepare a highly conductive ink composition (d), wherein the thermally decomposable organic silver particle has a weight percentage of 38 wt % and polymethyl methacrylate has a weight percentage of 4 wt %. The weight percentage is based on the total weight of the highly conductive ink composition (d). Thereafter, viscosity and photo stability of the ink composition were further measured. The measurement result is shown in Table 1.

EXAMPLE 3

The thermally decomposable organic silver particle formed in the example 1 was dissolved in xylene, in addition, the thermally decomposable polymer (A) (weight-average molecular weight (Mw): 2500 g/mol) formed in example 2 and dodecylbenzenesulfonic acid (DBSA) as a catalyst were further added, to prepare a highly conductive ink composition (e), wherein the thermally decomposable organic silver particle has a weight percentage of 38 wt %, the thermally decomposable polymer (A) has a weight percentage of 4 wt %, and dodecylbenzenesulfonic acid has a weight percentage of 0.2 wt %. The weight percentage is based on the total weight of the highly conductive ink composition (e). Thereafter, viscosity and photo stability of the ink composition were further measured. The measurement result is shown in Table 1.

EXAMPLE 4

The thermally decomposable organic silver particle formed in the example 1 was dissolved in xylene, in addition, the thermally decomposable polymer (A) (weight-average molecular weight (Mw): 2500 g/mol) formed in example 2 and dodecylbenzenesulfonic acid (DBSA) as a catalyst were further added, to prepare a highly conductive ink composition (f), wherein the thermally decomposable organic silver particle has a weight percentage of 37 wt %, the thermally decomposable polymer (A) has a weight percentage of 7 wt %, and dodecylbenzenesulfonic acid has a weight percentage of 0.4 wt %. The weight percentage is based on the total weight of the highly conductive ink composition (f). Thereafter, viscosity and photo stability of the ink composition were further measured. The measurement result is shown in Table 1.

EXAMPLE 5

The thermally decomposable organic silver particle formed in example 1 was dissolved in xylene, in addition, the thermally decomposable polymer (A) (weight-average molecular weight (Mw): 2500 g/mol) formed in example 2, polymethyl methacrylate (PMMA, weight-average molecular weight (Mw): 2300 g/mol), and dodecylbenzenesulfonic acid (DBSA) as a catalyst were further added, to prepare a highly conductive ink composition (g), wherein the thermally decomposable organic silver particle has a weight percentage of 37 wt %, the thermally decomposable polymer (A) has a weight percentage of 0.4 wt %, polymethyl methacrylate has a weight percentage of 1 wt %, and dodecylbenzenesulfonic acid has a weight percentage of 0.2 wt %. The weight percentage is based on the total weight of the highly conductive ink composition (g). Thereafter, viscosity and photo stability of the ink composition were further measured. The measurement result is shown in Table 1.

TABLE 1

| highly conductive ink composition | Ink Composition | | | | Physical Property | |
| --- | --- | --- | --- | --- | --- | --- |
| | SND (wt %) | PA (wt %) | PMMA (wt %) | DBSA (wt %) | Viscosity (cP) | Stability in light |
| (a) | 20 | — | — | — | 0.6 | <2 hr |
| (b) | 40 | — | — | — | 1.7 | <2 hr |
| (c) | 40 | — | 1 | — | 2.4 | 3 days |
| (d) | 38 | — | 4 | — | 2.8 | 3 days |
| (e) | 38 | 4 | — | 0.2 | 3.0 | 3 days |
| (f) | 37 | 7 | — | 0.4 | 4.0 | 7 days |
| (g) | 36 | 7 | 1 | 0.4 | 4.1 | 7 days |

SND: The thermally decomposable organic silver particle formed in the example 1 (silver neodecanoate)

PA: The thermally decomposable polymer (A) (weight-average molecular weight (Mw): 2500 g/mol) formed in example 2 (poly(N,O)acetal)

PMMA: Polymethyl methacrylate (weight-average molecular weight (Mw): 2300 g/mol)

DBSA: Dodecylbenzenesulfonic acid

Preparation of Metal Conductive Layer

COMPARATIVE EXAMPLES 5~8

Conductive ink compositions (a)~(d) formed in comparative examples 1~4 were formed on the glass sheet or PI film by spin coating for preparation of thin film. The formed thin film was heated in the vacuum oven. The oven was heated from room temperature to 150° C. and then vacuumed for one hour; thereafter, the temperature therein is raised to 200° C. The thin film was heated for two hours in the vacuum oven. Thus, the metal conductive layer (a), (b), (c), and (d) are respectively obtained. Subsequently, measurement of conductivity and adhesion of the metal conductive layer, Cross-Cut Test by 3M tape, were processed. The results are shown in Table 2.

COMPARATIVE EXAMPLES 6~8

Conductive ink compositions (e), (f), and (g) formed in comparative examples 3~5 were formed on the glass sheet or PI film by spin coating for preparation of thin film. The formed thin film was heated in the vacuum oven. The oven was heated from room temperature to 150° C. and then vacuumed for one hour; thereafter, the temperature therein was raised to 200° C. The thin film was heated for two hours under vacuum system. Thus, the metal conductive layer (e), (f), and (g) were respectively obtained. Subsequently, measurement of conductivity and adhesion of the metal conductive layer, Cross-Cut Test by 3M tape, were processed. The results are shown as Table 2.

TABLE 2

| Metal Conductive layer | Physical Property Test | |
|---|---|---|
| | Conductivity(S/cm) | Adhesion |
| (a) | $3 \times 10^5$ | bad |
| (b) | $3 \times 10^5$ | bad |
| (c) | $1 \times 10^4$ | good |
| (d) | $5 \times 10^3$ | good |
| (e) | $6 \times 10^4$ | good |
| (f) | $7 \times 10^3$ | good |

According to tables 1 and 2, thermally decomposable polymers are added to the highly conductive ink compositions in this disclosure. When the added amounts of the thermally decomposable polymers are up to 7 wt %, the conductivity of the metal conductive layer is raised to $1 \times 10^4$ S/cm. In contrast, for the ink compositions added by typical polymers, such as PMMA, when the added amounts of the thermally decomposable polymers are up to 4 wt %, the conductivity of the metal conductive layer is lowered to $5 \times 10^3$ S/cm.

The viscosity of the disclosed highly conductive ink composition can be adjusted and controlled by utilizing thermally decomposable organic polymers. Thus, a solution with a desired viscosity can be obtained by controlling and adjusting different solvent processes utilizing the highly conductive ink composition of the disclosure.

While the invention has been described by way of example and in terms of the preferred embodiments, it is to be understood that the invention is not limited to the disclosed embodiments. To the contrary, it is intended to cover various modifications and similar arrangements (as would be apparent to those skilled in the art). Therefore, the scope of the appended claims should be accorded the broadest interpretation so as to encompass all such modifications and similar arrangements.

What is claimed is:

1. A highly conductive ink composition, comprising:
   (a) a nanoscale metal particle or a metallo-organic decomposition (MOD) compound in an organic solvent with a homogeneous form; and
   (b) a thermally decomposable organic polymer in an organic solvent with a homogeneous form;
   wherein the weight ratio of (a) nanoscale metal particle or a metallo-organic decomposition compound and (b) the thermally decomposable organic polymer ranges from 1:9 to 9:1, and the thermally decomposable organic polymer comprises a chemical structure with a formula (I) shown as below:

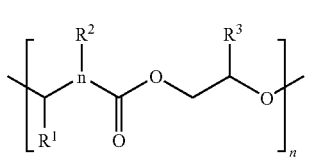

Formula(I)

wherein
$R^1$ comprises an alkyl group containing 1 to 8 carbon atoms or an aromatic group containing 3 to 8 carbon atoms;
$R^2$ and $R^3$ respectively comprise an alky group containing 1 to 8 carbon atoms, an alkoxide group containing 1 to 8 carbon atoms, a cycloalkyl group containing 3 to 8 carbon atoms, an aromatic group containing 3 to 8 carbon atoms, or an aralkyl group; and
n is an integer more than 1.

2. The highly conductive ink composition as claimed in claim 1, wherein the nanoscale metal particle comprises Au, Ag, Cu, Fe, Al, Pd or Ni.

3. The highly conductive ink composition as claimed in claim 1, wherein the metallo-organic decomposition compound comprises a metal organic compound of Au, Ag, Cu, Fe, Al, Pd or Ni with an organic functional group.

4. The highly conductive ink composition as claimed in claim 3, wherein the organic functional group comprises carboxyl, thiol, amine, sulfonyl, phosphate, or isocyano group.

5. The highly conductive ink composition as claimed in claim 1, wherein the thermally decomposable organic polymer has a weight-average molecular weight (Mw) ranging from 1000 to 300000 g/mol.

6. The highly conductive ink composition as claimed in claim 1, further comprising a catalyst.

7. The highly conductive ink composition as claimed in claim 6, wherein the catalyst comprises a protonic acid.

8. The highly conductive ink composition as claimed in claim 1, further comprising an additive, wherein the additive comprises a polymer or an inorganic compound.

9. The highly conductive ink composition as claimed in claim 1, wherein the highly conductive ink composition has a viscosity proportional to the molecular weight of the thermally decomposable organic polymer.

10. The highly conductive ink composition as claimed in claim 1, wherein the highly conductive ink composition has a viscosity more than 2 cP.

11. A method for fabricating a metal conductive pattern, comprising:
   preparing a highly conductive ink composition, wherein the highly conductive ink composition comprises:
   (a) a nanoscale metal particle or a metallo-organic decomposition (MOD) compound in an organic solvent with a homogeneous form; and
   (b) a thermally decomposable organic polymer in an organic solvent with a homogeneous form;
   wherein the weight ratio of (a) nanoscale metal particle or a metallo-organic decomposition compound and (b) the thermally decomposable organic polymer ranges from 1:9 to 9:1, and the thermally decomposable organic polymer comprises a chemical structure with a formula (I) shown as below:

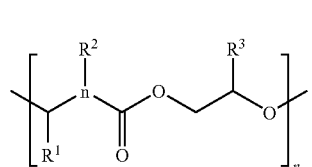

Formula(I)

wherein
$R^1$ comprises an alkyl group containing 1 to 8 carbon atoms or an aromatic group containing 3 to 8 carbon atoms;

$R^2$ and $R^3$ respectively comprise an alky group containing 1 to 8 carbon atoms, an alkoxide group containing 1 to 8 carbon atoms, a cycloalkyl group containing 3 to 8 carbon atoms, an aromatic group containing 3 to 8 carbon atoms, or an aralkyl group; and n is an integer more than 1;

forming the highly conductive ink composition on a predetermined area of a substrate; and thermally forming the highly conductive ink composition on the substrate to form a metal conductive pattern.

12. The method as claimed in claim 11, wherein forming the highly conductive ink composition on the substrate comprises screen printing, spin coating, and ink jet printing processes.

* * * * *